United States Patent
Tanabe et al.

(10) Patent No.: US 6,225,030 B1
(45) Date of Patent: May 1, 2001

(54) POST-ASHING TREATING METHOD FOR SUBSTRATES

(75) Inventors: Masahito Tanabe; Kazumasa Wakiya; Masakazu Kobayashi; Toshimasa Nakayama, all of Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/260,051

(22) Filed: Mar. 2, 1999

(30) Foreign Application Priority Data

Mar. 3, 1998 (JP) .................................. 10-067751

(51) Int. Cl.⁷ ................................ G03F 7/40; G03F 7/42
(52) U.S. Cl. .............................. 430/313; 430/329; 134/1
(58) Field of Search ................................. 430/312, 313, 430/329, 331; 134/1, 2

(56) References Cited

U.S. PATENT DOCUMENTS 4,873,177 * 10/1989 Tanaka ................................. 430/326
5,863,710    1/1999 Wakiya et al. ...................... 430/331

* cited by examiner

*Primary Examiner*—Kathleen Duda
(74) *Attorney, Agent, or Firm*—Wenderoth, Lind & Ponack, L.L.P.

(57) ABSTRACT

A post-ashing treating method for substrates comprising the following steps: forming a photoresist layer on a substrate having metallic layer(s) thereon; selectively exposing the photoresist layer to light; developing the light-exposed photoresist layer to provide a photoresist pattern; etching the substrate through the photoresist pattern as a mask pattern to form a metallic wired pattern; ashing the photoresist pattern; and after the completion of the ashing, bringing the substrate into contact with a treating liquid composition to thereby treat the substrate; characterized in that said treating liquid composition is one which comprises: (a) 0.5–10 wt % of a lower alkyl quaternary ammonium salt; (b) 1–50 wt % of a polyhydric alcohol; and (c) water as the balance. The post-ashing treating method for substrates provided by the present invention makes it possible to efficiently remove residues formed by dry etching followed by ashing under strict conditions and to achieve favorable corrosion-inhibiting effects on the substrates.

2 Claims, No Drawings

POST-ASHING TREATING METHOD FOR SUBSTRATES

BACKGROUND OF THE INVENTION

1. Field of the Invention

This invention relates to a post-ashing treating method for substrates. More particularly, the invention relates to a post-ashing treating method for substrates which exhibits an excellent performance in treating substrates having been dry-etched under strict conditions followed by ashing and also exerts favorable corrosion-inhibiting effects on various metallic wires and metallic layers. The present invention is appropriately applicable to the production of semiconductor devices such as Ics and LSIs as well as liquid-crystal panel devices.

2. Description of Relevant Art

Semiconductor devices such as ICs and LSIs as well as liquid-crystal panel devices are fabricated by a process comprising the following steps: forming a conductive metallic layer or an insulating layer such as an $SiO_2$ film formed onto a substrate by chemical vapor deposition or other suitable techniques; applying a uniform photoresist layer over the metallic or insulating layer; selectively exposing the applied photoresist layer to light and developing the exposed layer to form a photoresist pattern; selectively etching the above-mentioned conductive metallic layer or insulating layer through the photoresist pattern as a mask pattern to form a fineline circuit; and stripping away the unwanted photoresist layer.

As the metallic layer, use may be made of various ones, for example, aluminum (Al), an aluminum alloy (Al alloy) such as aluminum-silicon (Al—Si), aluminum-copper (Al—Cu) or aluminum-silicon-copper (Al—Si—Cu); pure titanium (Ti); or a titanium alloy (Ti alloy) such as titanium nitride (TiN) or a titanium-tungsten system (TiW). One or more of such metallic layers are formed onto the substrate.

With the recent tendency toward high-density integrated circuits, dry etching enabling fine etching with a higher density has become the major means. Also, it has been a practice to employ plasma ashing, etc. to remove the unwanted photoresist layers after etching.

After the completion of these strict processing, resist residues such as modified photoresist films would adhere and remain in the side or bottom of patterns. It is also observed that metal depositions are formed in the step of etching metallic layers. It is, therefore, necessary to completely remove these residues, as there arises some problems, for example, a decrease in the yield of producing semiconductors.

These residues differ in composition from one another depending on the type of the etching gas employed, the ashing conditions, the type of the metallic layer(s) formed on the substrate, the type of the photoresist employed, etc. In recent years, attempts have been made to improve semiconductors by various methods. As a result, the treating conditions in each step become strict and a great variety of metals are employed therefor. Consequently, the residues and depositions become complicated, which make it difficult to identify the those compositions. Under these circumstances, no satisfactory treating liquid has been known so far. Among all, it is very difficult to completely remove residues of photoresists to which inorganic natures have been imparted by plasma gases.

As liquid compositions for treating these residues, Unexamined Published Japanese Patent Application No. 222,574/1996 has disclosed detergent compositions which comprise alcohols and quaternary ammonium hydroxides. Although these compositions can exert treating performance at a certain extent, there arises another problem that metallic layers are corroded away thereby.

The present inventors conducted intensive studies with a view to solving the above-mentioned problems. As a result, they found that these problems could be solved by treating substrates with treating liquid compositions containing lower alkyl quaternary ammonium salts, polyhydric alcohols and water in specified proportions. The present invention has been accomplished on the basis of this finding.

SUMMARY OF THE INVENTION

An object, therefore, of the present invention is to provide a post-ashing treating method for substrates which exhibits, in treating substrates provided with metallic layers having been dry-etched under strict conditions followed by ashing, excellent effects of removing resist residues such as modified photoresist films and metal depositions and also exerts favorable corrosion-inhibiting effects on the substrates.

Accordingly, the present invention relates to a post-ashing treating method for substrates comprising the following steps:

(I) forming a photoresist layer on a substrate having metallic layer(s) thereon;

(II) selectively exposing the photoresist layer to light;

(III) developing the light-exposed photoresist layer to provide a photoresist pattern;

(IV) etching the substrate through the photoresist pattern as a mask pattern to form a metallic wired pattern;

(V) ashing the photoresist pattern; and (VI) after the completion of the ashing, bringing the substrate into contact with a treating liquid composition to thereby treat the substrate;

characterized in that the treating liquid composition employed above is one which comprises: (a) 0.5–10 wt % of a lower alkyl quaternary ammonium salt; (b) 1–50 wt % of a polyhydric alcohol; and (c) water as the balance.

DETAILED DESCRIPTION OF THE INVENTION

Now, the post-ashing treating method for substrates according to the present invention will be described in detail.

In the method of the present invention, use is made of treating liquid compositions comprising: (a) 0.5–10 wt % of lower alkyl quaternary ammonium salts; (b) 1–50 wt % of polyhydric alcohols; and (c) water as the balance.

The term "lower alkyl" as used in component (a) means alkyl groups having 1 to 6 carbon atoms. Particular examples of the lower alkyl quaternary ammonium salts include tetramethylammonium hydroxide (TMAH), tetraethylammonium hydroxide, tetrapropylammonium hydroxide, trimethylethylammonium hydroxide, (2-hydroxyethyl)trimethylammonium hydroxide (i.e., choline), (2-hydroxyethyl)triethylammonium hydroxide, (2-hydroxyethyl)tripropylammonium hydroxide and (1-hydroxypropyl)trimethylammonium hydroxide. Among all, it is preferable to use TMAH, choline, etc. These lower alkyl quaternary ammonium salts may be used either independently or in combination with themselves.

As component (b), it is preferable to use one or more members selected from the group consisting of glycerol, ethylene glycol, propylene glycol, 1,2-butylene glycol, 1,3-butylene glycol and 2,3-butylene glycol. Among all, glycerol is particularly preferred. These polyhydric alcohols may be used either independently or in combination with themselves.

Water is used as component (c).

The treating liquid compositions to be used in the present invention contain components (a) to (c) in the following proportions: 0.5–10 wt %, preferably 1–5 wt %, of component (a); 1–50 wt %, preferably 3–40 wt %, of component (b); and component (c) as the balance.

The proportion of each component is particularly important in the present invention. When component (a) is used in excess or component (b) is used in short, no sufficient corrosion-inhibiting is ensured. When component (b) is used in excess or component (a) is used in short, on the other hand, the ability to remove residues is deteriorated.

When the method of the present invention is employed in a dip treatment or a shower treatment wherein a substrate is brought into contact with a treating liquid composition for a long time (i.e., 5 to 20 min), it is preferable that the composition contains component (b) in a relatively large amount, i.e., 25–50 wt %, still preferably 30 to 45 wt %. In a paddle treatment wherein the contact is completed within a short period time (i.e., 30 sec to 1 min), it is preferable that component (b) is used in a relatively small amount, i.e., 1–25 wt %, still preferably 3–20 wt %.

These treating liquid compositions may further contain water-soluble organic solvents, surfactants, etc., so long as the effects of the present invention are not deteriorated thereby.

Examples of the water-soluble organic solvents include: sulfoxides such as dimethylsulfoxide; sulfones such as dimethylsulfone, diethylsulfone, bis(2-hydroxyethyl)sulfone and tetramethylenesulfone; amides such as N,N-dimethylformamide, N-methylformamide, N,N-dimethylacetamide, N-methylacetamide and N,N-diethylacetamide; lactams such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; and imidazolidinones such as 1,3-dimethyl-2-imidazolidinone, 1,3-diethyl-2-imidazolidinone and 1,3-diisopropyl-2-imidazolidinone. These water-soluble organic solvents may be used either independently or in combination with themselves.

The method of treating substrates according to the present invention comprising the following steps:

(I) forming a photoresist layer on a substrate having metallic layer(s) thereon;

(II) selectively exposing the photoresist layer to light;

(III) developing the light-exposed photoresist layer to provide a photoresist pattern;

(IV) etching the substrate through the photoresist pattern as a mask pattern to form a metallic wired pattern;

(V) ashing the photoresist pattern; and (VI) after the completion of the ashing, bringing the substrate into contact with the above-described treating liquid composition to thereby treat the substrate.

More particularly speaking, a metallic film and, if desired, an insulating layer such as $SiO_2$ are formed by chemical vapor deposition, etc. onto a substrate made of, for example, silicon wafer or glass. Next, a photoresist layer is formed thereon.

As the metallic layer, use may be made of various ones, for example, aluminum (Al), an aluminum alloy (Al alloy) such as aluminum-silicon (Al—Si), aluminum-copper (Al—Cu) or aluminum-silicon-copper (Al—Si—Cu); pure titanium (Ti); or a titanium alloy (Ti alloy) such as titanium nitride (TiN) or a titanium-tungsten system (TiW). One or more of such metallic layers are formed onto the substrate. When Al or an Al alloy (Al—Si, Al—Cu, Al—Si—Cu, etc.), or pure Ti or a Ti alloy (TiN, TiW, etc.) is used, residues are frequently adhered after performing ashing as a post-treatment. Accordingly, the treating liquid compositions of the present invention are particularly effective in removing these residues and in preventing these metallic layers from corrosion.

In the formation of the photoresist layer as described above, it is advantageous to use photoresists, including both negative and positive-working ones, which can be developed with aqueous alkali solutions. Examples of these photoresists include; (I) a positive-working photoresist containing a naphthoquinone diazide compound and a novolac resin; (ii) a positive-working photoresist containing a compound which generates an acid upon light-exposure, a compound which is decomposed with an acid to become more soluble in an aqueous alkali solution and an alkali-soluble resin; (iii) a positive-working photoresist containing a compound which generates an acid upon light-exposure and an alkali-soluble resin containing groups that is decomposed with an acid to become more soluble in an aqueous alkali solution; and (iv) a negative-working photoresist containing a compound which generates an acid upon light-exposure, a crosslinking agent and an alkali-soluble resin; though the present invention is not restricted thereto.

Next, the photoresist layer is exposed to light and developed to form a photoresist pattern. The light-exposure and development conditions may be appropriately selected depending on the photoresist which is selected so as to attain the desired purpose. The light-exposure may be carried out by, for example, exposing the photoresist layer to light through a desired patterned mask with the use of a light source (for example, a low pressure mercury lamp, a high pressure mercury lamp, an ultra-high pressure mercury lamp, or a xenon lamp) capable of emitting active rays (for example, ultraviolet rays, far-ultraviolet rays, excimer lasers, X-rays, or electron beams). Alternatively, the photoresist layer is irradiated with electron beams under scanning. Subsequently, the photoresist layer is subjected to post-exposure baking, if necessary.

Next, patterning development is carried out by using a photoresist developer and thus the desired photoresist pattern can be obtained. The development may be effected by an arbitrary method without restriction. For example, use may be made of any method appropriate for the purpose, for example, the immersion development method which comprises immersing the substrate having the photoresist applied thereonto in a developer for a definite time followed by washing with water and drying; a paddle development method which comprises dropping a developer onto the surface of the photoresist applied onto the substrate and allowing it to stand for a definite time followed by washing with water and drying; and the spray development method which comprises spraying a developer onto the surface of the photoresist followed by washing with water and drying.

Then, the above-mentioned conductive metallic layer or insulating layer is selectively etched by dry etching, etc. with the use of the photoresist pattern formed above as a mask to thereby give a fineline circuit. Next, the unwanted photoresist layer is removed by plasma ashing. In this step, the substrate is contaminated, though in a small amount, with foreign matters, resist residues (i.e., the modified photoresist film) remaining after the ashing and metal depositions formed in the step of etching the metallic layer.

Therefore, these residues are brought into contact with the above-mentioned treating liquid composition and thus removed from the substrate. Use of the above-mentioned treating liquid composition makes it possible to easily remove these residues such as the modified photoresist films and metal depositions. When the substrate having a metal such as Al or an Al alloy thereonto, in particular, an excellent corrosion-inhibiting effect is established on the substrate thereby.

After the completion of the ashing, the substrate can be brought into contact with the liquid treating composition by, for example, the paddle method, the dip method or the shower method. The paddle method is a sheet-processing method which comprises dropping the treating liquid from a nozzle onto each substrate, thus bringing the substrate into contact with the treating liquid by taking advantage of surface tension for a definite time, and then rotating the substrate with a spinner, etc., thus splashing off the liquid. The dip method comprises immersing each wafer cassette in a tank filled up with the treating liquid for a definite time. The shower method comprises rotating each wafer cassette and spraying the treating liquid thereonto from a plural number of nozzles in a single direction.

Compared with the paddle treatment of the sheet-processing type, each wafer cassette can be treated as a unit by the dip treatment and the shower treatment. In these cases, however, the substrate should be in contact with the treating liquid over a prolonged time. It is, therefore, preferable to use a treating liquid composition containing component (b) at a higher proportion, i.e., 25–50 wt %, still preferably 30–45 wt % in the composition, for the dip treatment or the shower treatment. For the paddle treatment, on the other hand, it is preferable to use a treating liquid composition containing compound (b) at a lower proportion, i.e., 1–25 wt %, still preferably 3–20 wt % in the composition.

According to the treating method of the present invention, residues such as modified photoresist films and metal depositions on substrates can be removed completely and metallic layers can be effectively prevented from corrosion.

EXAMPLES

The following examples are provided for the purpose of further illustrating the present invention but are by no means intended to limit the same.

Examples 1–9 and Comparative Examples 1–4

A positive-working photoresist coating solution was prepared by dissolving 100 parts by weight of a cresol novolac resin and 30 parts by weight of 2,3,4-trihydroxybenzophenone naphthoquinone-1,2-diazide-5-sulfonate in 390 parts by weight of ethylene glycol monoethyl ether acetate and filtering the resultant solution via a membrane filter of 0.2 $\mu$m in pore size.

Next, this positive-working photoresist coating solution was applied by spin coating onto a substrate which was a 4-inch silicon wafer having successively a pure titanium (Ti) layer as the first layer, an Al—Si—Cu layer as the second layer and a TiN layer as the third layer formed by chemical vapor deposition. The applied coating was dried at 110° C. for 90 sec to form a photoresist layer in a film thickness of 1.35 $\mu$m. The photoresist layer was exposed to light through a mask pattern using NSR-1505G4D (product of Nikon Corp.) and subsequently developed with an aqueous solution of 2.38 wt % tetramethylammonium hydroxide (TMAH) at 23° C. for 65 sec followed by rinsing with pure water for 30 sec.

Next, the substrate having the thus formed photoresist pattern was dry etched in a conventional manner. Then this photoresist pattern was subjected to plasma ashing at 150° C. for 60 sec with the use of an ashing device TCA-3822 (product of Tokyo Ohka Kogyo Co., Ltd.).

Subsequently, the plasma-ashed substrate was treated by the paddle method with the use of each treating liquid composition as listed in Table 1 at 23° C. for 30 sec or 1 min followed by washing with pure water.

After the completion of this treatment, the strippability of the residues on the substrate and the states of corrosion in the Ti, Al—Si—Cu and TiN layers formed by deposition on the substrate were evaluated by photographing under an SEM (scanning electron microscope). Table 1 shows the results. Neither the Ti layer nor the TiN layer suffered from any corrosion.

The criteria for evaluation of the strippability of the residues were as follows:

◯: showing no residue;

Δ: showing some residue;

×: showing much residue.

The criteria for evaluation of the corrosion state were as follows:

◯: no corrosion;

Δ: slight corrosion;

×: considerable corrosion.

TABLE 1

| | Treating liquid composition (wt %) | | | After immersing 30 sec | | After immersing 1 min | |
|---|---|---|---|---|---|---|---|
| No. | (a) | (b) | (c) | Strippability of residue | Corrosion state (Al-Si-Cu layer) | Strippability | Corrosion state (Al-Si-Cu layer) |
| Ex. 1 | TMAH 2.38 | GLY 5 | water balance | ◯ | ◯ | ◯ | ◯ |
| Ex. 2 | TMAH 2.38 | GLY 20 | water balance | ◯ | ◯ | ◯ | ◯ |
| Ex. 3 | TMAH 3.0 | GLY 5 | water balance | ◯ | ◯ | ◯ | ◯ |
| Ex. 4 | TMAH 3.0 | GLY 20 | water balance | ◯ | ◯ | ◯ | ◯ |
| Ex. 5 | TMAH 4.5 | GLY 5 | water balance | ◯ | ◯ | ◯ | Δ |
| Ex. 6 | TMAH 4.5 | GLY 20 | water balance | ◯ | ◯ | ◯ | ◯ |
| Ex. 7 | CHOL 2.38 | EG 15 | water balance | ◯ | ◯ | ◯ | ◯ |
| Ex. 8 | CHOL 3.0 | EG 15 | water balance | ◯ | ◯ | ◯ | ◯ |
| Ex. 9 | CHOL 4.0 | EG 15 | water balance | ◯ | ◯ | ◯ | ◯ |
| C. Ex. 1 | TMAH 2.38 | — | water balance | ◯ | Δ | ◯ | X |
| C. Ex. 2 | TMAH 3.0 | — | water balance | ◯ | X | ◯ | X |
| C. Ex. 3 | TMAH 4.5 | — | water balance | ◯ | X | ◯ | X |
| C. Ex. 4 | — | GLY 10 | water balance | X | ◯ | X | ◯ |

In the above Table 1, TMAH stands for tetramethylammonium hydroxide; GLY stands for glycerol; CHOL stands for (2-hydroxyethyl)trimethylammonium hydroxide; and EG represents ethylene glycol.

Example 10

A substrate which had been treated till the ashing step as the same manners as in Examples 1 to 9 was treated by the dip method at 23° C. for 10 min with the use of a treating liquid comprising 2.38 wt % of TMAH, 30 wt % of glycero as the balance. Thus, the residues on the substrate were completely removed and any corrosion was not occurred.

Comparative Example 5

A substrate which had been treated till the ashing step as the same manners as in Example 10 was treated by the dip method at 23° C. for 10 min with the use of a treating liquid comprising 2.38 wt % of TMAH, 50 wt % of methanol and water as the balance. Although the residues on the substrate were completely removed thereby, a corrosion was occurred in the Al—Si—Cu layer.

Comparative Example 6

A substrate which had been treated till the ashing step as the same manners as in Example 10 was treated by the dip method at 23° C. for 10 min with the use of a treating liquid comprising 2.38 wt % of TMAH, 60 wt % of glycerol and water as the balance. Thus, the residues remained on the substrate.

As described above in detail, the present invention provides a post-ashing treating method for substrates which exhibits an excellent strippability of residues such as modified photoresist films and metal depositions formed by dry etching followed by ashing under strict conditions and remaining on the substrate surface and achieves favorable corrosion-inhibiting effects on the substrates.

What is claimed is:

1. A post-ashing treating method for substrates comprising the following steps:

I. forming a photoresist layer on a substrate having metallic layer(s) thereon;
   II. selectively exposing the photoresist layer to light;
   III. developing the light-exposed photoresist layer to provide a photoresist pattern;
   IV. dry etching the substrate through the photoresist pattern as a mask pattern to form a metallic wired pattern;
   V. ashing the photoresist pattern; and
   VI. after the completion of the ashing, bringing the substrate into contact with a treating liquid composition to thereby treat the substrate;

wherein in step (VI), the substrate is brought into contact either with (i) the treating liquid composition for 30 seconds to 1 minute by a paddle method and use is made, as said treating liquid composition, of one comprising (a) 0.5–10 wt % of a lower alkyl quaternary ammonium salt, (b) 1–25 wt % of a polyhydric alcohol which is at least one member selected from the group consisting of glycerol, ethylene glycol, propylene glycol, 1,2-butylene glycol, 1,3-butylene glycol and 2,3-butylene glycol, and (c) water as the balance, or with (ii) the treating liquid composition for 5 to 20 min by a dip method or a shower method and use is made, as said treating liquid composition, of one comprising (a) 0.5–10 wt % of the lower alkyl quaternary ammonium salt, (b) 25–50 wt % of the polyhydric alcohol; and (c) water as the balance.

2. A method according to claim 1, wherein said component (a) is tetramethylammonium hydroxide and/or (2-hydroxyethyl)trimethylammonium hydroxide.

* * * * *